United States Patent
Fish et al.

(10) Patent No.: US 6,628,690 B1
(45) Date of Patent: *Sep. 30, 2003

(54) OPTO-ELECTRONIC LASER WITH INTEGRATED MODULATOR

(75) Inventors: Gregory Fish, Santa Barbara, CA (US); Larry Coldren, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 336 days.

This patent is subject to a terminal disclaimer.

(21) Appl. No.: 09/614,378

(22) Filed: Jul. 12, 2000

Related U.S. Application Data

(63) Continuation-in-part of application No. 09/614,377, filed on Jul. 12, 2000, and a continuation-in-part of application No. 09/614,895, filed on Jul. 12, 2000, now Pat. No. 6,349,106, and a continuation-in-part of application No. 09/614,674, filed on Jul. 12, 2000, and a continuation-in-part of application No. 09/614,376, filed on Jul. 12, 2000, and a continuation-in-part of application No. 09/614,375, filed on Jul. 12, 2000, and a continuation-in-part of application No. 09/614,378, filed on Jul. 12, 2000, and a continuation-in-part of application No. 09/614,665, filed on Jul. 12, 2000, and a continuation-in-part of application No. 09/614,224, filed on Jul. 12, 2000.

(60) Provisional application No. 60/152,072, filed on Sep. 2, 1999, provisional application No. 60/152,049, filed on Sep. 2, 1999, and provisional application No. 60/152,038, filed on Sep. 2, 1999.

(51) Int. Cl.[7] .............................. H01J 5/026
(52) U.S. Cl. ...................................... 372/50
(58) Field of Search ............................ 372/50

(56) References Cited

U.S. PATENT DOCUMENTS

| | | | | |
|---|---|---|---|---|
| 4,563,765 A | * | 1/1986 | Tsang et al. | 372/50 |
| 4,896,325 A | * | 1/1990 | Coldren | 372/20 |
| 5,084,894 A | * | 1/1992 | Yamamoto | 372/50 |

(List continued on next page.)

FOREIGN PATENT DOCUMENTS

| | | | |
|---|---|---|---|
| EP | 1 539 028 | 1/1979 | ............ H01S/3/02 |
| EP | 0 620 475 A1 | 3/1994 | ........... G02F/1/313 |

OTHER PUBLICATIONS

Bar–Chaim, N. et al., "Monolithic Optoelectronic Integration of a GaAlAs Laser, a Field–Effect Transistor, and a Photodiode", *Applied Physics Letters, US, American Institute of Physics,* May 15, 1984, vol. 44, No. 10, pp. 941–943.

Koch, T.L., "Semiconductor Photonic Integrated Circuits", *IEEE Journal of Quantum Electronics,* Mar. 27, 1991, No. 3, pp. 641–653.

Byoung–Sung, K. et al., "Dynamic Analysis of Widely Tunable Laser Diodes Integrated with Sampled–and–Chirped–Grating Distributed Bragg Reflectors and an Electroabsorption Modulator", *IEICE Trans Electron,* Aug. 1998, vol. E81–C, No. 8, pp. 1342–1349.

San–Liang, L. et al., "Sampled Grating DBR Laser Arrays with Adjustable 0.8/1.6–nm Wavelength Spacing", *IEEE Photonics Technology Letters,* Aug. 1999, vol. 11, No. 8, pp. 955–957.

Jayaraman, V. et al., "Theory, Design, and Performance of Extended Tuning Range Semiconductor Lasers with Sampled Gratings", *IEEE Journal of Quantum Electronics,* Jun. 29, 1993, vol. 29, No. 6, pp. 1824–1834.

*Primary Examiner*—Paul Ip
*Assistant Examiner*—Jeffrey Zahn
(74) *Attorney, Agent, or Firm*—Gates & Cooper LLP

(57) ABSTRACT

A laser assembly includes an epitaxial structure formed on a substrate. A laser resonator, a modulator and a coupler are formed in the epitaxial structure. The coupler is positioned to receive and adjust an output received from the modulator.

38 Claims, 6 Drawing Sheets

U.S. PATENT DOCUMENTS

| | | | |
|---|---|---|---|
| 5,088,105 A | 2/1992 | Scifres et al. | 372/92 |
| 5,145,792 A * | 9/1992 | Hirata | 438/36 |
| 5,253,314 A * | 10/1993 | Alferness et al. | 385/40 |
| 5,274,649 A * | 12/1993 | Hirayama et al. | 372/20 |
| 5,325,392 A * | 6/1994 | Tohmori et al. | 372/96 |
| 5,452,118 A * | 9/1995 | Maruska | 359/191 |
| 5,479,539 A | 12/1995 | Goldsmith et al. | 385/14 |
| 5,525,541 A | 6/1996 | Krauz et al. | 438/38 |
| 5,539,571 A * | 7/1996 | Welch et al. | 359/344 |
| 5,625,636 A | 4/1997 | Bryan et al. | 372/50 |
| 5,674,778 A | 10/1997 | Lee et al. | 438/24 |
| 5,715,268 A | 2/1998 | Lang et al. | 372/50 |
| 5,742,045 A | 4/1998 | Parker et al. | 250/214 A |
| 5,838,714 A * | 11/1998 | Delorme | 372/96 |
| 6,031,851 A * | 2/2000 | Shimizu et al. | 372/18 |
| 6,208,454 B1 * | 3/2001 | Koren et al. | 359/326 |
| 6,349,106 B1 * | 2/2002 | Coldren | 372/50 |

* cited by examiner

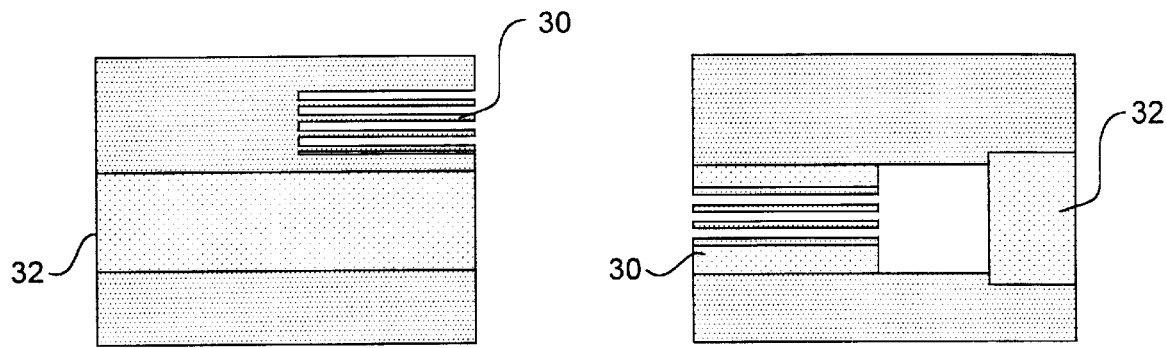
FIG. 3(a)  FIG. 3(b)
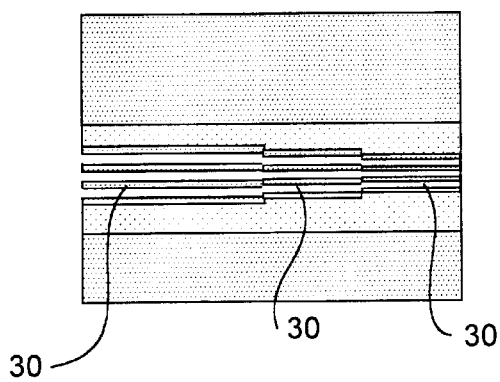 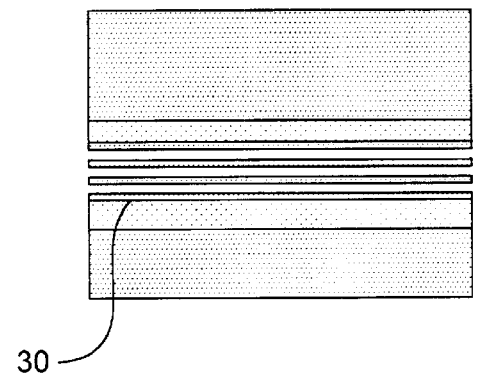
FIG. 3(c)  FIG. 3(d)

OPTO-ELECTRONIC LASER WITH INTEGRATED MODULATOR

CROSS-REFERENCE TO RELATED APPLICATION

This application is a continuation-in-part and claims the benefit of priority of U.S. Provisional Application Serial No. 60/152,072, filed Sep. 2, 1999, U.S. Provisional Application Serial No. 60/152,049, filed Sep. 2, 1999, U.S. Provisional Application Serial No. 60/152,038, filed Sep. 2, 1999, which applications are fully incorporated by reference herein. This application is also a continuation-in-part of U.S. Ser. Nos. 09/614,377, 09/614,895 (now U.S. Pat. No. 6,349,106, issued Feb. 19, 2002), 09/614,674, 09/614,376, 09/614,375, 09/614,378, 09/614,665 and 09/614,224, filed on the same date which applications are fully incorporated by reference herein.

BACKGROUND OF THE INVENTION

1. Field of the Invention

This invention relates generally to laser assemblies, and more particularly to a widely tunable laser assembly with an integrated modulator.

2. Brief Description of the Related Art

A laser transmitter for fiber optic networks must provide signals at a given stable wavelength, modulated at a desired rate with low chirp and an appropriate power launched into optical fiber. Current networks have as many as 100 wavelength channels with one laser devoted to each channel, and each laser having an external modulator. Significantly greater efficiencies could be realized with a laser transmitter and a modulator included on a chip, wherein the modulated laser is capable of being tuned to cover every channel of a system.

Photonic integration can be used to provide a laser transmitter on a chip, as is well understood in the art. FIG. 1 shows a block diagram of a structure that can be used to accomplish this. While photonic integration is well known in the art, prior art efforts have been focused on the integration of lasers that are not widely tunable. Kobayashi, N.; Noda, A.; Watanabe, T.; Miura, S.; Odagawa, T.; Ogita, S. "2.5-Gb/s-1200-km transmission of electroabsorption modulator integrated DFB laser with quarter-wavelength-shifted corrugation," IEEE Photonics Technology Letters, vol. 11, (no.8), IEEE, August. 1999. p.1039–41;Delprat, D.; Ramdane, A.; Silvestre, L.; Ougazzaden, A.; Delorme, F.; Slempkes, S. "20-Gb/s integrated DBR laser-EA modulator by selective area growth for 1.55- mu m WDM applications," IEEE Photonics Technology Letters, vol.9, no.7, IEEE, July 1997. p.898–900. Large tuning ranges make achieving adequate performance of these functional blocks non-obvious with respect to the teachings of the prior art in general, and the prior art related to narrowly tunable devices in particular. What is needed is photonic integration techniques to construct a widely tunable laser apparatus including an integrated modulator.

SUMMARY

Accordingly, an object of the present invention is to provide a laser assembly where all of the elements are fabricated on a single wafer.

Another object of the present invention is to provide a diode laser assembly with the elements derived from a common epitaxial layer structure.

A further object of the present invention is to provide a widely tunable diode laser assembly with an integrated modulator.

Yet another object of the present invention is to provide a diode laser assembly with the elements fabricated on a single wafer by common process steps.

A further object of the present invention is to provide a monolithically integrated diode laser assembly using fabrication steps that tailor optical properties of selected regions to a desired electro-optic function.

Another object of the present invention is to provide a monolithically integrated diode laser assembly that uses common fabrication process steps to form the apparatus elements that are compatible with photonic device fabrication processes presently used in the lightwave industry.

These and other objects of the present invention are achieved in a laser assembly that includes an epitaxial structure formed on a substrate. A laser resonator, a modulator and a coupler are formed in the epitaxial structure. The coupler is positioned to receive and adjust an output received from the modulator.

In another embodiment of the present invention, a laser assembly includes a first semiconductor layer and a second semiconductor layer in an epitaxial structure. The first and second semiconductor layers have different dopings. A waveguide layer is formed between the first and second semiconductor layers. The first waveguide layer includes a first reflector and a second reflector. An optically active gain medium is disposed between the first and second reflectors. The first and second reflectors define a laser resonator. A modulator is formed in the epitaxial structure outside of the laser resonator. A coupler is formed in the epitaxial structure. The coupler is positioned to receive and adjust an output received from the modulator.

BRIEF DESCRIPTION OF THE FIGURES

FIG. 3(a) is a cross sectional view of the FIG. 2 assembly illustrating several layer structures and the integration of two different band gap materials by an offset quantum well technique.

FIG. 3(b) is a cross sectional view of the FIG. 2 assembly illustrating several layer structures and the integration of two different band gap materials by butt-joint regrowth.

FIG. 3(c) is a cross sectional view of the FIG. 2 assembly that illustrates one embodiment for the integration of several different band gap materials by selective area growth (SAG).

FIG. 3(d) is a cross sectional view of the FIG. 2 assembly that illustrates one embodiment for the integration of several different band gap materials by quantum well intermixing.

DETAILED DESCRIPTION

Figure 2:
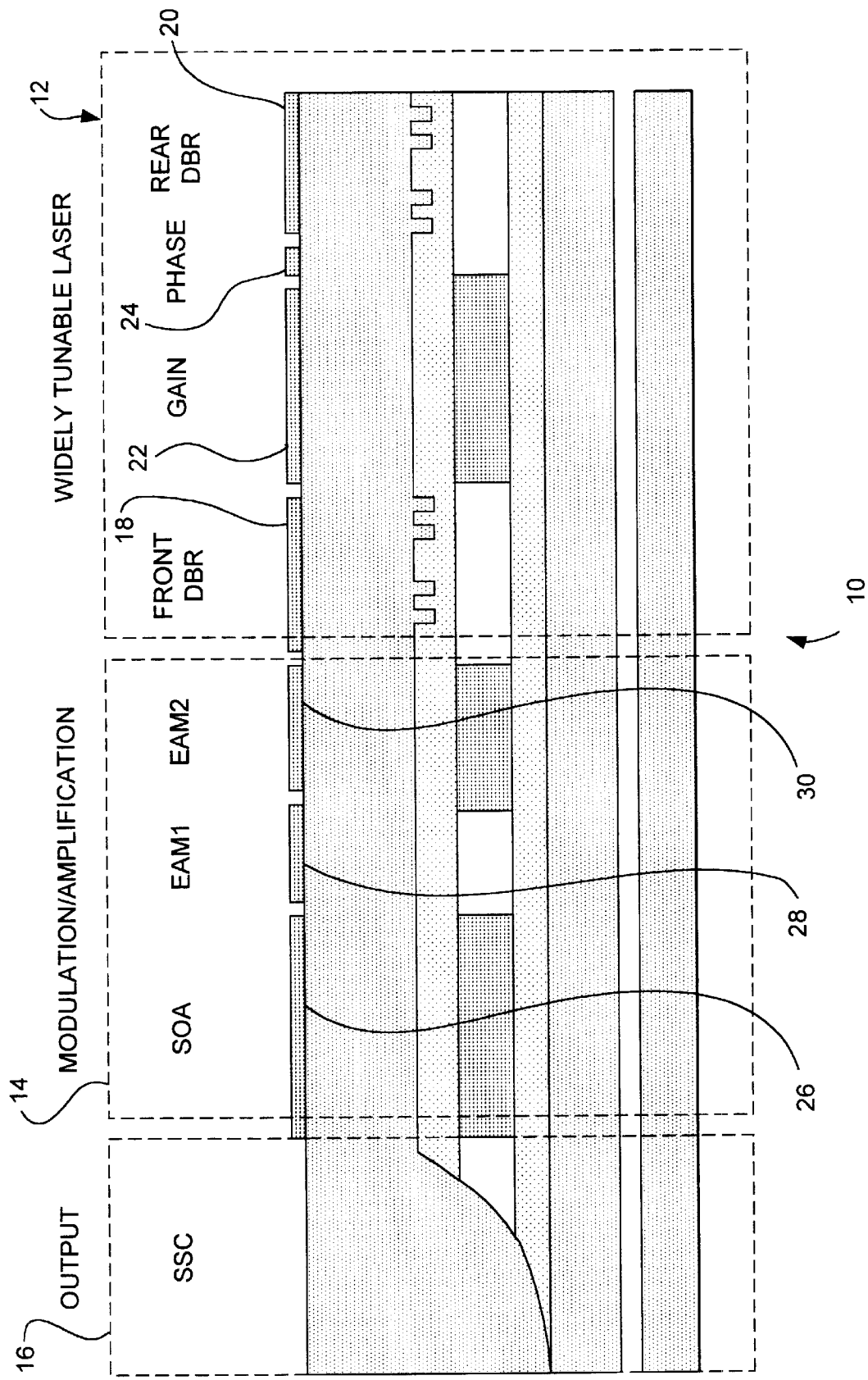
FIG. 2 is a cross-sectional view of one embodiment of a widely tunable laser assembly of the present invention

Referring to FIG. 2, one embodiment of the present invention is a widely tunable laser assembly 10 with an epitaxial structure formed on a substrate. For purposes of this specification, a widely tunable laser is defined as a laser whose output wavelength can be tuned over a wider wavelength range than achievable by conventional index tuning, i.e. $\Delta\lambda/\lambda > \Delta n/n$, and whose wavelength selective elements are within the same optical waveguide, i.e. not a parallel array of DFB lasers.

A laser element 12 and a modulator element 14 are formed in the epitaxial structure. Also formed in the epitaxial structure is an output coupler element 16 positioned to receive and adjust an output received from modulator 14. The various elements are fabricated by common process steps.

Laser 12 includes front and back mirrors 18 and 20 which can be distributed Bragg reflectors ("DBR's"). A gain section 22 is positioned in laser 12 as is a mode selection section 24. Mode selection section 24 can be a lateral mode selection element, a longitudinal mode selection element, a controllable phase shifting element, and the like.

Modulator 14 can include a semiconductor optical amplifier 26 ("SOA 26"), a first electro-absorption modulator ("EAM 28") and a second EAM 30.

Laser 12 is preferably widely tunable to produce laser emission with the desired spectral properties, e.g. linewidth, SMSR, wavelength, over the entire wavelength band, or at least a significant fraction, to be used in a WDM optical communication system. In one embodiment, the wavelength bands of interest lie within 1300–1600 nm range and typically have a bandwidth determined by the gain characteristics of optical fiber amplifiers. In one embodiment, laser 12 is an SG/SSG-DBR laser that includes two SG/SSG-DBR mirrors 18 and 20, gain section 22, and phase section 24. Jayaraman, V.; Chuang, Z.-M.; Coldren, L. A. "Theory, design, and performance of extended tuning range semiconductor lasers with sampled gratings.", IEEE Journal of Quantum Electronics, vol.29, (no.6), June 1993, p.1824–34.

Figure 1:
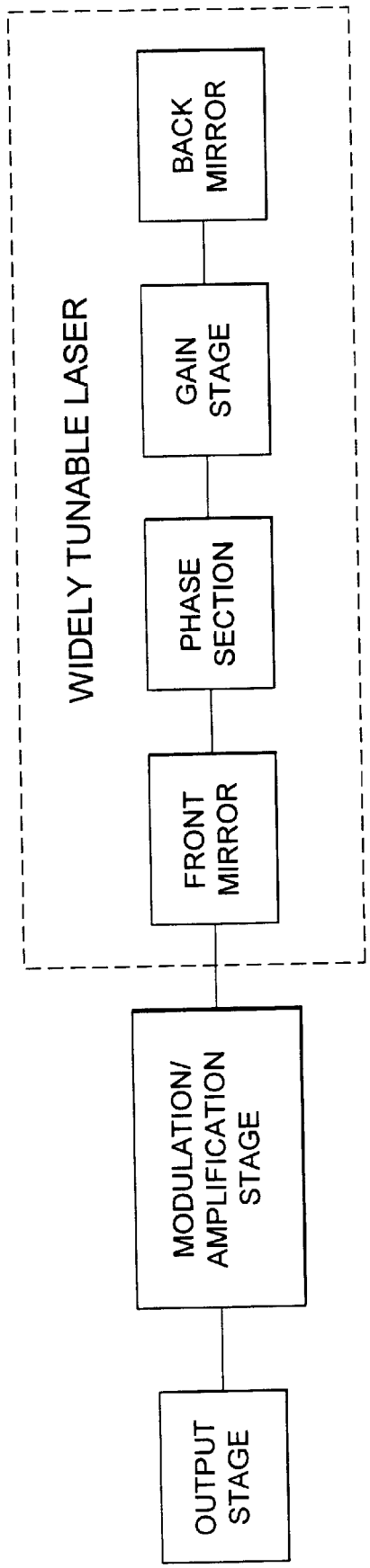
FIG. 1 is a block diagram of a laser assembly that illustrates different functional elements of a laser assembly.

In this embodiment, the bandgap of the gain section 22 is chosen to provide gain over the wavelength band of interest. The bandgap of SG/SSG-DBR mirrors 18 and 20 and phase section 24 is selected to provide wavelength coverage over the desired wavelength band with the lowest loss and tuning currents. Other embodiments that can be used for laser 12 include but are not limited to the GCSR laser (Oberg, M.; Nilsson, S.; Streubel, K.; Wallin, J.; Backbom, L.; Klinga, T. "74 nm wavelength tuning range of an InGaAsP/InP vertical grating assisted codirectional coupler laser with rear sampled grating reflector," IEEE Photonics Technology Letters, vol.5, (no.7), July 1993, p.735–7) in which the output is taken from the SG/SSG-DBR mirror side, allowing the integration of the other elements as illustrated in FIG. 1. Another embodiment for the widely tunable laser 12 is a series connected, gain coupled DFB laser. Hong, J.; Kim, H.; Shepherd, F.; Rogers, C.; Baulcomb, B.; Clements, S., "Matrix-grating strongly gain-coupled (MC-SGC) DFB lasers with 34-nm continuous wavelength tuning range," IEEE Photonics Technology Letters, vol.11, (no.5), IEEE, May 1999, p.515–17. Both of these embodiments can be integrated with the other elements of FIG. 2.

Modulator 14 encodes data onto the optical carrier produced by widely tunable laser 12. The characteristics of the modulation that are desired are: suitable on/off ratio, control of the instantaneous wavelength such as chirp, low drive voltage, and high saturation power. For analog modulation it is desirable to have very linear response, as well.

Modulator 14 can be an electro-absorption modulator and include a plurality of electro-absorption modulators. In one embodiment, modulator 14 has the same bandgap as front mirror section 18. In another embodiment, modulator 14 has a different bandgap than front mirror section 18. In another embodiment, modulator includes a plurality of modulator sections that have differing bandgaps. Modulator 14 can include non-radiative carrier traps to reduce carrier lifetime of the modulator material. Further, modulator 14 can include an optical amplifier configured to receive an output of the electro-absorption modulator 14. In another embodiment, modulator 14 includes an optical amplifier configured to produce an output incident on the electro-absorption modulator. An electro-absorption modulator can be positioned between first and second optical amplifiers.

Output coupler 16 is used to increase the coupling efficiency and alignment tolerance to whatever optical assembly follows assembly 10, including but not limited to an optical fiber or lenses preceding an optical fiber. Output coupler 16 reduces a modal reflectivity at an output facet of output coupler 16 and modifies an output mode shape of laser 12.

An important aspect of achieving the structure of FIG. 2 is the use of areas that have different band gaps to accomplish their specialized tasks. A way of specifying this band gap is to give the wavelength peak of the photoluminescence emitted from these sections. Gain section of laser 12 and SOA 26 have band gaps that are chosen to provide gain in the wavelength range over which laser 12 is to operate. Front and back mirrors 18 and 20 have a band gap chosen to provide an index change, with a minimum of optical loss, needed to tune a lasing wavelength between adjacent peaks of a sampled grating mirror over the entire wavelength range. The band gap and length of modulator 14 is chosen to give the required extinction of the lasing wavelength at a reverse bias that is easily obtainable for a given modulation speed.

The monolithic integration of optically dissimilar elements of assembly 10 is accomplished by a method of fabrication that tailors optical properties of selected regions to a desired electro-optic function. Tailored optical properties, including the band gap, result in optically active and passive regions on the same wafer beginning from a common epitaxial layer structure. Further, the common fabrication process steps required for forming the apparatus elements are compatible with photonic device fabrication processes presently used in the lightwave industry. Thus, the apparatus of the present invention is readily manufacturable.

In a particular embodiment, the fabrication methods to selectively tailor the band gaps of regions of the wafer include the steps of implantation of impurities by low energy ions, for example less than about 200 eV, in a portion of a selected wafer region near the wafer surface. The wafer is then annealed. This allows the impurities and vacancies implanted near the wafer surface to diffuse throughout the selected region and tailor the region's band gap to a desired electro-optic function.

For example, in the passive waveguide regions of the phase shift and mirror sections of assembly 10, the effective bandgap should be somewhat larger (e.g.,>0.1 eV) than the operating lightwave energy, which is only slightly larger (typically~0.01–0.05 eV) than the effective band gap of the active layers in gain section 22. Integrated external modulator elements 14 may have sections with the same larger bandgap as the other passive regions, or a bandgap intermediate between that of the active and passive sections for some desired functionality such as chirp reduction or improved linearity. Integrated external amplifier elements may have the same bandgap as the active gain section or a slightly modified bandgap for some functionality, such as increased saturation power or improved chirp of modulator/amplifier combinations.

In many embodiments, the passive regions are created by selective removal of the lowest bandgap layers responsible for gain in the active regions within the same sequence as some other processing steps, such as grating formation in the mirror regions, are being carried out. In these cases ion-implantation process is not necessary but can be utilized to better tailor other regions such as in integrated modulators and/or amplifier elements. This sequence is followed by a regrowth of the upper cladding layers required for the top portion of the optical waveguide.

There are several layer structures, well known to those skilled in the art, which allow the integration of areas having different band gaps.

FIGS. 3(a) through 3(d) illustrate several of these structures. The simplest approach is to grow a mixed quantum well ("MQW 30") gain section on top of passive waveguide layer 32 as illustrated in FIG. 3(a). An advantage of the FIG. 3(a) embodiment is simplicity, plus the band gap and geometry of each section can be somewhat optimized for the task the given area is to perform. In another embodiment, illustrated in FIG. 3(b), MQW 30 is formed by butt joint growth. This embodiment allows fully independent optimization of the different band gap regions. Butt-joint regrowth involves etching away the layers in one area of the device and selectively regrowing layers with the desired band gap. Wallin, J.; Landgren, G.; Strubel, K.; Nilsson, S.; Oberg, M. "Selective area regrowth of butt-joint coupled waveguides in multi-section DBR lasers." Journal of Crystal Growth, vol.124, no.1–4, Nov, 1992, p.741–6.

More sophisticated structures for achieving multiple band gap regions are illustrated in FIGS. 3(c) and 3(d). In FIG. 3(c), selective area growth ("SAG") involves growing the desired layer structure on a substrate patterned with dielectric masks. Aoki, M.; Suzuki, M.; Sano, H.; Taniwatari, T.; Tsutsui, T.; Kawano, T., "Quantum energy control of multiple-quantum-well structures by selective area MOCVD and its application to photonic integrated devices," Electronics and Communications in Japan, Part 2 (Electronics), vol.77, (no.10), October 1994, p. 33–44. The presence of the masks perturbs the growth and enhances the growth rate near the masks. MQW regions 30, with different band gaps, can subsequently be grown using masks of different widths to grow quantum well having different thickness. In FIG. 3(d) a MQW region 30 is grown with the lowest of the desired band gaps. By inter-mixing the quantum well and barrier the band gap of the structure is blue-shifted . Hofstetter, D.; Maisenholder, B.; Zappe, H. P., "Quantum-well intermixing for fabrication of lasers and photonic integrated circuits," IEEE Journal of Selected Topics in Quantum Electronics, vol.4, no.4, IEEE, July-August, 1998, p.794–802. The amount of this blue shift is determined by the initial compositions of the well and barrier, and the amount of intermixing. By spatially controlling the amount of inter-mixing several regions having different band gaps can be created.

One material system of a preferred embodiment of the present invention is InGaAsP/InP, in which citing the bandgap of the particular lattice matched alloy specifies the bulk material desired, as well as the alloys required to obtain the quantum well material whose PL peak corresponds to the cited band gap. The desired properties can also be achieved by using alloys in the InGaAlAs/InP system having the specified bandgap. When different band gaps are chosen or specified for the embodiments, it is implied that one or more of the techniques illustrated in FIGS. 3(a) through 3(d) have been used appropriately to create the band gaps specified for all of the elements of assembly 10. These techniques, and their combinations, are known to those skilled in the art and are capable of achieving the specifications of all the following embodiments. (Delprat, D.; Ramdane, A.; Silvestre, L.; Ougazzaden, A.; Delorme, F.; Slempkes, S. "20-Gb/s integrated DBR laser-EA modulator by selective area growth for 1.55- mu m WDM applications," IEEE Photonics Technology Letters, vol.9, no.7, IEEE, July 1997. p.898–900; Hansen, P. B.; Raybon, G.; Koren, U.; Miller, B. I.; Young, M. G.; Newkirk, M. A.; Chien, M.-D.; Tell, B.; Burrus, C. A., "Monolithic semiconductor soliton transmitter," Journal of Lightwave Technology, vol.13, (no.2), Feb. 1995. p.297–301; Wallin, J.; Landgren, G.; Strubel, K.; Nilsson, S.; Oberg, M. "Selective area regrowth of butt-joint coupled waveguides in multi-section DBR lasers." Journal of Crystal Growth, vol.124, no.1–4, Nov, 1992, p.741–6; Aoki, M.; Suzuki, M.; Sano, H.; Taniwatari, T.; Tsutsui, T.; Kawano, T., "Quantum energy control of multiple-quantum-well structures by selective area MOCVD and its application to photonic integrated devices," Electronics and Communications in Japan, Part 2 (Electronics), vol.77, (no.10), October 1994, p. 33–44; Hofstetter, D.; Maisenholder, B.; Zappe, H. P., "Quantum-well intermixing for fabrication of lasers and photonic integrated circuits," IEEE Journal of Selected Topics in Quantum Electronics, vol.4, no.4, IEEE, July-August, 1998, p.794–802). It is known to those skilled in the art that certain of these techniques require quantum well regions to allow band gap tuning. The specified band gaps of the embodiments refer to the PL peak of the sections subsequent to all band gap tuning efforts, regardless whether they are bulk or quantum well.

Laser 12, modulator 14 and output coupler 16 are electrically isolated from each other, such that the operation of one does not interfere electrically with any adjacent section, within or among the elements of FIG. 2.

Figure 4:
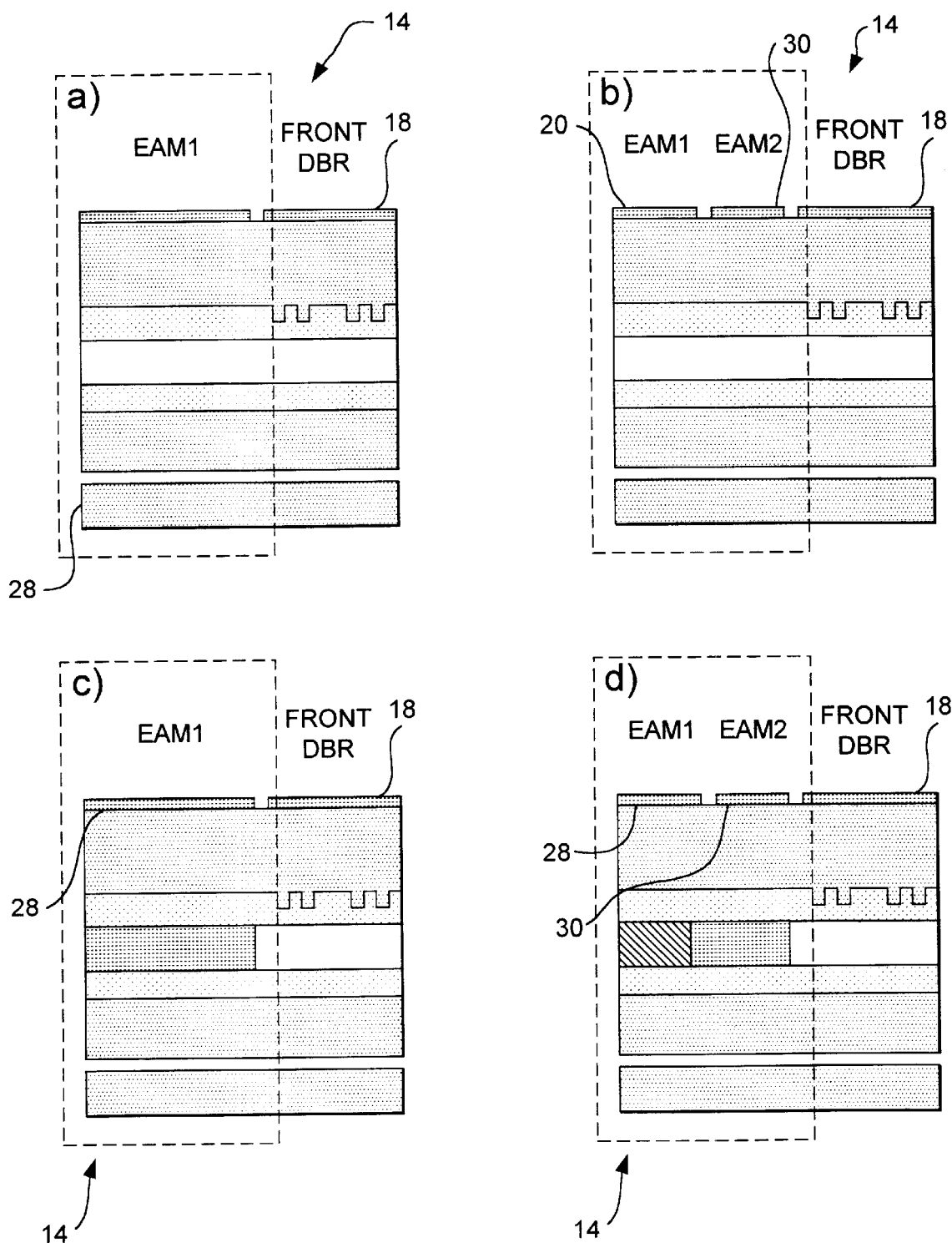
FIG. 4(a) illustrates one embodiment of the modulator element of FIG. 2 with a single section modulator that uses the same bandgap material as the front mirror.
FIG. 4(b) illustrates a tandem embodiment of the FIG. 2 modulator element that uses the same bandgap material as the front mirror in order to provide better chirp and linearity performance.
FIG. 4(c) illustrates a single section modulator embodiment of the FIG. 2 modulator element that uses a bandgap material chosen to provide the best chirp, drive voltage and on/off ratio over a particular wavelength range.
FIG. 4(d) illustrates a tandem modulator embodiment of the FIG. 2 modulator element with bandgap materials chosen to provide the best chirp, drive voltage and on/off ratio performance, for the composite modulator, over a wider wavelength range than achievable by a single modulator section.

FIGS. 4 (a) through 4(d) illustrate several embodiments of modulator 14 in which electro-absorption is used to create the modulation. In FIG. 4(a), EAM section 28 uses the same bandgap material as SG/SSG-DBR 18. In order to optimize the modulation characteristics the DC bias can be adjusted for each wavelength produced by laser 12. Separate optimization of the band gap may be desired for EAM section 28 and SG/SSG-DBR 18 in which one of the FIGS. 3(a) through 3(d) embodiments is used to produce the desired bandgaps. The result is shown in FIG. 4(c).

Due to the widely tunable nature of laser 12 it is difficult to achieve optimal performance for all the parameters listed above at every wavelength using a single modulator section. By splitting the contact one or more times, as shown in FIG. 4(b) with first and second EAM sections 28 and 30, separate biases can be applied to each EAM section 28 and 30 with the identical modulation or modulation with a phase/amplitude shift between EAM sections 28 and 30. This tandem modulation scheme is advantageous for the control of chirp and achieving higher linearity.

The embodiment illustrated in FIG. 4(b) can be further extended by also adjusting the bandgap of each of the modulator sections, as illustrated in FIG. 4(d). The bandgap of each EAM section 28 and 30 is chosen so its absorption is tuned to provide a suitable on/off ratio, drive voltage and chirp for a subset of wavelengths within the range emitted by laser 12. By properly biasing each EAM section 28 and 30, the composite modulator 14 can produce these optimal characteristics over the entire wavelength range of laser 12. Furthermore, the modulation can be applied appropriately to one or more of EAM sections 28 and 30 with or without a phase/amplitude shift, to enhance the chirp or linearity over what can be achieved through modulating only a single EAM section.

To achieve higher saturation powers the carrier lifetime of the material composing modulator 14 is reduced. Suitable quantum well structures with reduced carrier lifetimes can be used to achieve this purpose. Czajkowski, I. K.; Gibbon, M. A.; Thompson, G. H. B.; Greene, P. D.; Smith, A. D.; Silver, M. Strain-compensated MQW electroabsorption modulator for increased optical power handling. Electronics Letters, vol.30, (no.11), May 26, 1994., p.900–1. It is important that these quantum well structures are achieved subsequent to all bandgap tuning steps. Alternatively, traps can be introduced via an implantation step for example, to reduce the carrier lifetime through non-radiative processes. Woodward, T. K.; Knox, W. H.; Tell, B.; Vinattieri, A.; Asom, M. T., "Experimental studies of proton-implanted GaAs-AlGaAs multiple-quantum-well modulators for low-photocurrent applications," IEEE Journal of Quantum Electronics, vol.30, (no.12), December 1994, p.2854–65. Due to the insertion loss suffered in EAM sections 28 and 30, it may be advantageous, but not necessary, to add amplification with SOA 2 to modulator 14 element.

FIGS. 5(a) through 5(d) illustrate several embodiments of modulator 14 that contain amplification. While only one embodiment for the modulation part of the modulation/amplification element is illustrated, FIG. 4(d), it will be appreciated that any of the FIGS. 4(a) through 4(c) embodiments can also be used.

Figure 5:
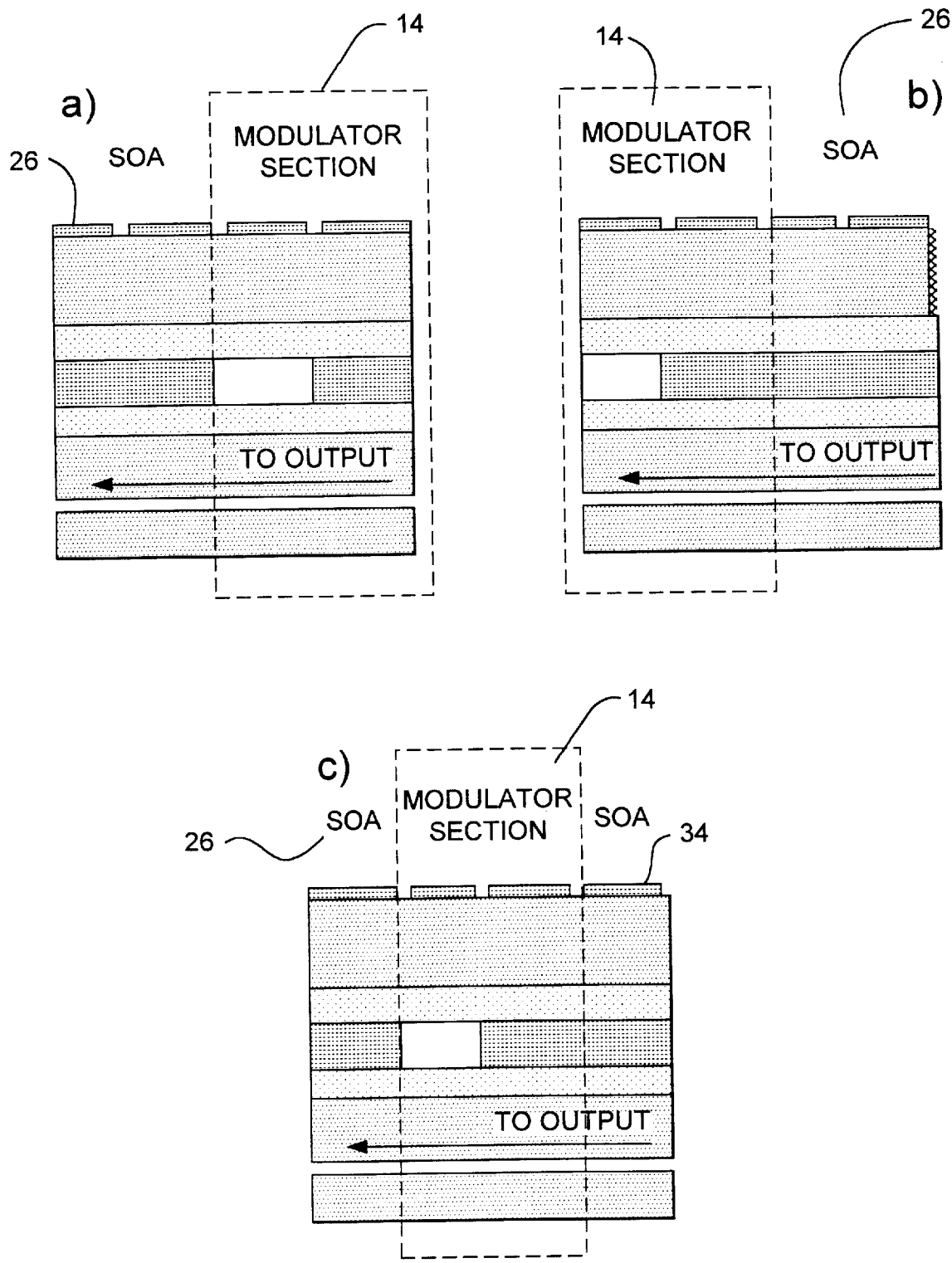
FIG. 5(a) is a cross-sectional view of one embodiment of the FIG. 2 modulator element that includes post EAM amplification with a single section amplifier to provide highest output power at the expense of reduced extinction due to ASE.
FIG. 5(b) is a cross-sectional view of one embodiment of the FIG. 2 modulator element with an amplifier preceding the EAM to prevent extinction ratio degradation at the expense of lower output power due to modulator insertion loss.
FIG. 5(c) is a cross-sectional view of one embodiment of the FIG. 2 modulator element that uses a combination of pre and post-amplification to achieve the highest output power with a minimum of extinction ratio degradation.

FIG. 5(a) illustrates an embodiment in which SOA 26 follows modulator 14. This embodiment is advantageous for producing the highest output power given a particular saturation power of SOA 26. An additional advantage is the ability to use the nonlinearity in SOA 26 to compensate for positive chirp in the EAM section 28. Woodward, T. K.; Knox, W. H.; Tell, B.; Vinattieri, A.; Asom, M. T., "Experimental studies of proton-implanted GaAs-AlGaAs multiple-quantum-well modulators for low-photocurrent applications," IEEE Journal of Quantum Electronics, vol.30, (no.12), December 1994, p.2854–65;Watanabe, T.; Sakaida, N.; Yasaka, H.; Koga, M.,"Chirp control of an optical signal using phase modulation in a semiconductor optical amplifier," IEEE Photonics Technology Letters, vol.10, (no.7), IEEE, July 1998, p.1027–9.

FIG. 5(b) illustrates an embodiment in which SOA 26 precedes modulator (14). This embodiment is advantageous for preserving the extinction ratio of modulator 14 and preventing the introduction of unmodulated ASE into the network. A disadvantage of this embodiment is the reduction of output power achievable due to the saturation of SOA 26 and insertion loss of EAM 28. It is also no longer possible to compensate any positive chirp that may be produced in EAM section 28 with SOA 26.

FIG. 5(c) illustrates an embodiment in which SOA 28 and SOA 34 both precede and follow EAM section 30. This embodiment allows the maximum achievable output power to be increased over the purely preceding SOA 28 of the FIG. 5(b) embodiment with less noise and extinction ratio degradation than the purely following SOA 26 of FIG. 5(a). Additionally, this embodiment also uses the nonlinearity in SOA 26 to compensate for positive chirp in EAM section 28

Furthermore, it may be advantageous to use a tandem amplification scheme in which separate biases are applied to a split contact amplifier to independently control the noise and gain saturation properties of the composite amplifier. All of the FIGS. 5(a), 5(b) and 5(c) embodiments can be implemented using such a tandem amplification scheme.

Another way of controlling the saturated output power of an SOA is by adjusting its width and/or the bandgap of the gain material to increase the carrier lifetime for higher optical powers. Any adjustment in the width performed adiabatically to insure low optical transition loss. FIG. 6(a) illustrates one embodiment of output coupler 16 with an output coupler waveguide 36. In this embodiment, the thickness of output coupler waveguide 34 is tapered to allow the output mode to be defined by an underlying layer.38. The coupling efficiency and alignment tolerance are simultaneously increased by converting the optical mode that is used in every other element of the FIG. 2 embodiment, the photonic circuit ("PIC" mode), to a larger optical mode, the fiber matched ("FM" mode), more closely matching that of a lensed optical fiber.

The methods for transforming the mode size are well known to those skilled in the art, and usually involve an adiabatic tapering of the core that determines the PIC optical mode. This tapering can be performed laterally such as by tapering the width of the core, or vertically by tapering the thickness of the core. Kawano, K.; Kohtoku, M.; Okamoto, H.; Itaya, Y.; Naganuma, M., "Comparison of coupling characteristics for several spotsize-converter-integrated laser diodes in the 1.3- mu m-wavelength region," IEEE Photonics Technology, vol.9, (no.4), IEEE, April 1997. p. 428–30. These tapers are preferably performed in a nonlinear manner to reduce the mode transformation loss for shorter taper lengths. J. D. Love, "Application of a low-loss criterion to optical waveguides and devices," IEE Proceedings J (Optoelectronics), vol.136, pp. 225–8, 1989. Underlying waveguide layer 38 can be used to define the FM mode. This is advantageous because the FM mode shape is very sensitive to the dimensions of the tapered down PIC waveguide core which is used to define it, making it difficult to reproducible fabricate the desired FM mode shape. By including underlying waveguide layer 38 the PIC waveguide core can be completely removed allowing the FM mode to be determined solely by underlying waveguide layer 38. Furthermore, the refractive index of underlying waveguide layer 38 is diluted such that the presence of layer 38 does not affect the PIC mode shape and the FM mode shape is more tolerant to the underlying layer dimensions.

Output coupler waveguide 36 can be tapered non-linearly, tapered in a direction substantially parallel to an optical axis of laser 12 or tapered in a direction substantially normal to an optical axis of laser 12. Tapering of output coupler waveguide 36 means that a sectional area "X" of the waveguide varies along waveguide 36. Output coupler waveguide 36 can be oriented along a crystallographic axis of the epitaxial structure of assembly 10.

Another use of output coupler 16 is to lower the modal reflectivity at an output facet 40 to less than $10^{-5}$. There are several methods well known to those skilled in the art to accomplish this. In one embodiment, this is achieved by depositing a dielectric AR coating 42 to achieve this reflectivity.

Figure 6:
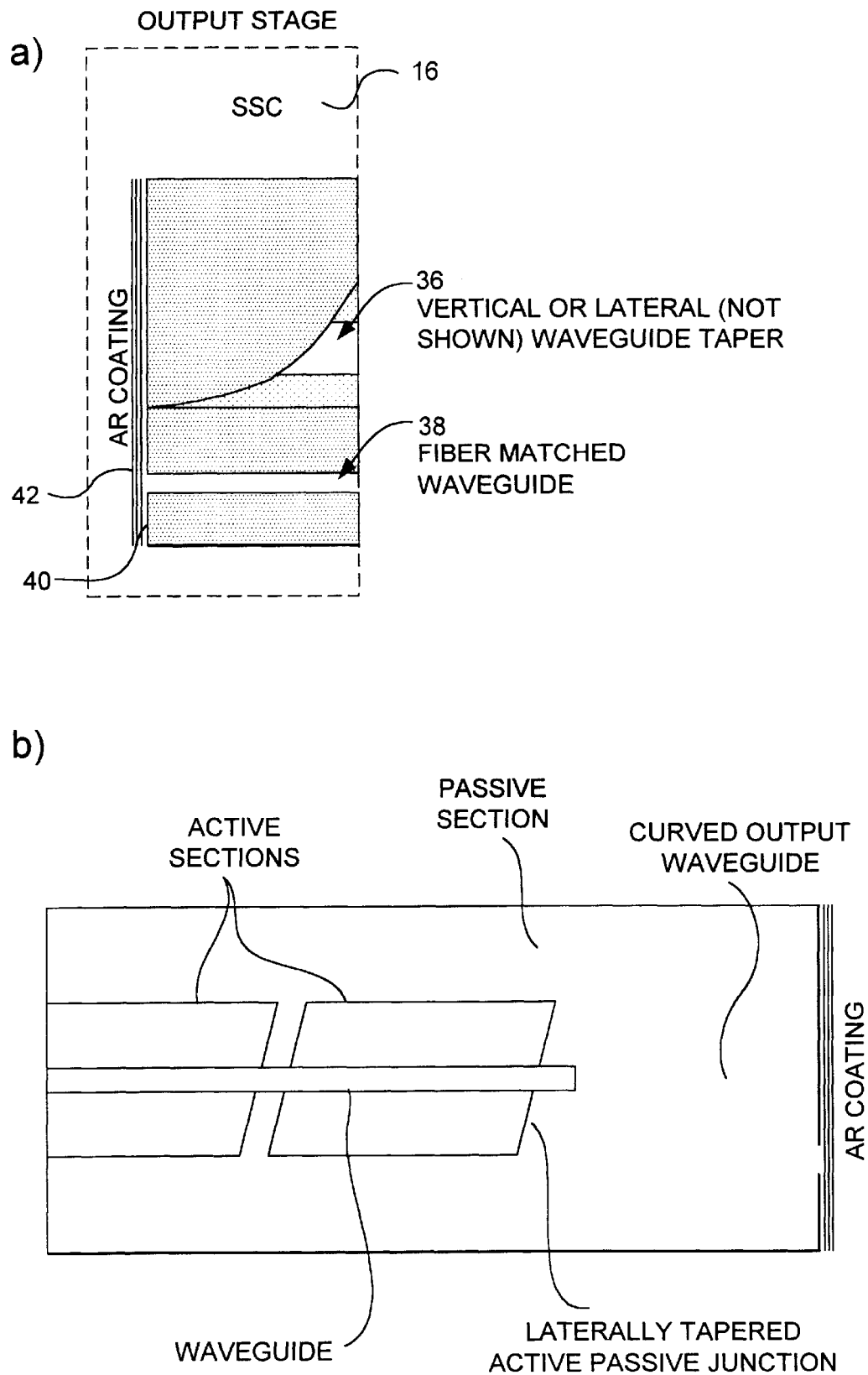
FIG. 6(a) is a cross-sectional view of one embodiment of the FIG. 2 output coupler element where a thickness of the waveguide is tapered to allow the output mode to be defined by an underlying waveguide layer.
FIG. 6(b) is a top view of one embodiment of the FIG. 2 output coupler element illustrating that the waveguide's width and angle of incidence upon the facet has been changed to promote high coupling efficiency and low modal reflectivity.
Figure 6A:
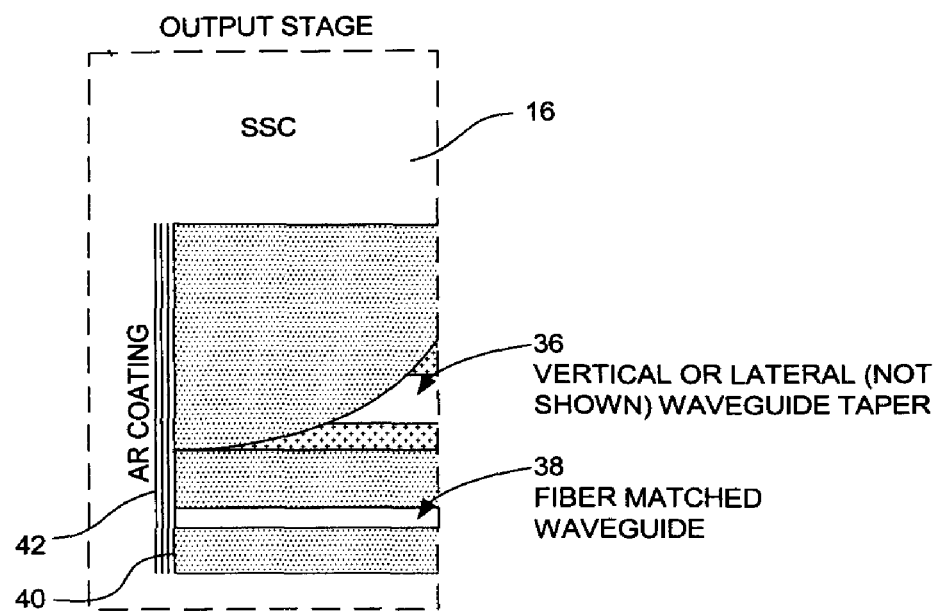
Figure 6B:
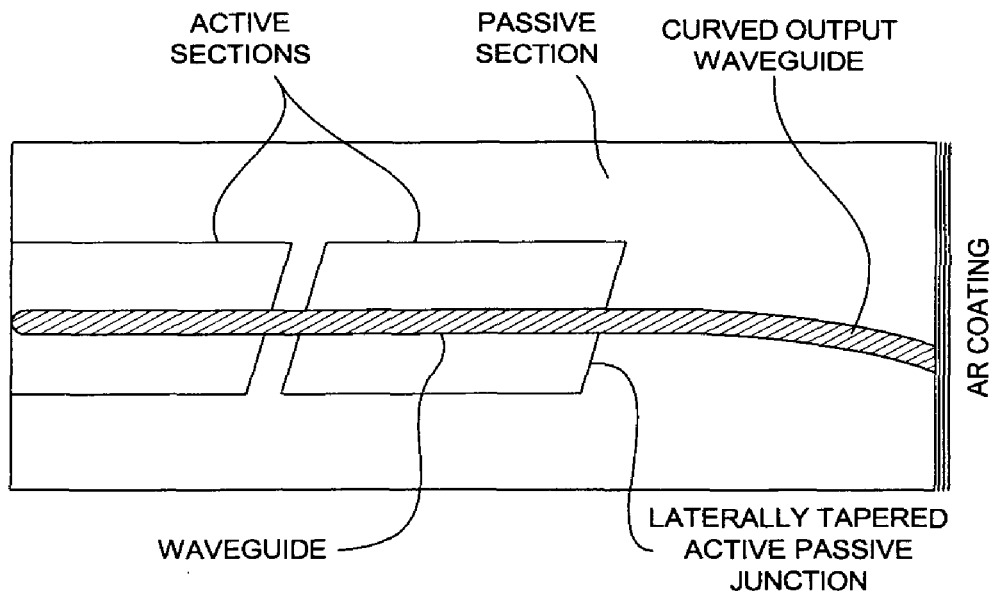

FIG. 6(b) illustrates an embodiment in which the angle of incidence of output coupler waveguide 36 at output facet 40 is chosen to lower the modal reflectivity to $10^{-4}$, allowing a simpler, broadband, AR coating to be used to reach $10^{-5}$ reflectivity. Output coupler waveguide 36 is curved to reach the desired angle. The curvature is controlled so that higher order modes are not significantly excited. Curving of waveguide 36 to reach the desired angle permits waveguide 36 to be oriented along a crystallographic direction on the remainder of assembly 10. This is advantageous because of the crystallographic nature, well know to those skilled in the art, of many process steps required for the fabrication of assembly 10. Additionally, due to the long lengths of assembly 10, angling waveguide 36 along the entire length of assembly 10 may cause the die that is used in the process to be excessively wide.

In one embodiment, output coupler 16 includes at least one active region and at least one passive region. An interface between the active and passive regions can be substantially normal or oblique to a centerline of output coupler waveguide 36. Reflections at the interface between the active and passive sections can be reduced by adiabatically tapering output coupler waveguide 36. Tapered sections of output coupler waveguide 36 can be in the passive or active sections. Output coupler waveguide 36 extends through the active and passive regions and can be truncated prior to reaching an output facet of output coupler 16. Additionally, an end of output coupler waveguide 36 can terminate at an oblique angle to the output facet of output coupler 36.

In another embodiment, output coupler 16 can include two or more active regions and a passive region. The active regions can be independently controllable and separated by a passive region.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A diode laser assembly, comprising:
   a substrate;
   an epitaxial structure formed on the substrate;
   a tunable laser resonator formed in the epitaxial structure that produces an output, the tunable laser resonator including first and second reflectors, a gain section and a phase section, the gain section and the phase section each being positioned between the first and second reflectors, wherein the output wavelength is tunable over a wider wavelength range than is achievable by index tuning of any one section, and the wider wavelength range is represented by $\Delta\lambda/\lambda > \Delta n/n$;
   a modulator with at least a first section and a second section formed in the epitaxial structure outside of the tunable laser resonator, wherein separate electrical connections are provided to the first and second sections of the modulator that are configured to control an amplitude and phase response of the output from the tunable laser resonator by applying a reverse bias to change an electric field in the first and second sections of the modulator; and
   a coupler formed in the epitaxial structure, the coupler being positioned and configured to receive an output from the modulator, reduce back reflections to the modulator and couple the output of the modulator to a following optical assembly.

2. The assembly of claim 1, wherein the coupler reduces a modal reflectivity at an output facet of the coupler.

3. The assembly of claim 1, wherein the coupler modifies an output mode shape of the tunable laser resonator.

4. The assembly of claim 1, wherein the coupler includes an optical waveguide.

5. The assembly of claim 1, wherein the coupler includes a first optical waveguide and a second optical waveguide underlying the first optical waveguide.

6. The assembly of claim 5, wherein at least one of the optical waveguides is tapered.

7. The assembly of claim 5, wherein at least one of the optical waveguides is tapered non-linearly.

8. The assembly of claim 5, wherein at least one of the optical waveguides is tapered in a direction substantially parallel to an optical axis of the tunable laser resonator.

9. The assembly of claim 5, wherein at least one of the optical waveguides is tapered in a direction substantially normal to an optical axis of the tunable laser resonator.

10. The assembly of claim 5, wherein at least one of the optical waveguides is oriented along a crystallographic axis of the epitaxial structure.

11. The assembly of claim 1, wherein the modulator is an electro-absorption modulator.

12. The assembly of claim 1, wherein the modulator includes a plurality of electro-absorption modulators.

13. The assembly of claim 1, wherein the modulator has a same bandgap as a front mirror within the tunable laser resonator.

14. The assembly of claim 1, wherein the modulator has a different bandgap as a front mirror within the tunable laser resonator.

15. The assembly of claim 1, wherein the modulator sections have differing bandgaps.

16. The assembly of claim 1, wherein the modulator includes non-radiative carrier traps to reduce a carrier lifetime of the modulator material.

17. The assembly of claim 11, wherein the modulator includes an optical amplifier configured to receive an output of the electro-absorption modulator.

18. The assembly of claim 11, wherein the modulator includes an optical amplifier configured to produce an output incident on the electro-absorption modulator.

19. The assembly of claim 11, wherein the modulator includes an electro-absorption modulator positioned between a first and a second optical amplifiers.

20. The assembly of claim 1, wherein the assembly has a common epitaxial structure with areas of differing bandgaps.

21. The assembly of claim 1, wherein the tunable laser resonator includes a mode selection element.

22. The assembly of claim 21, wherein the mode selection element is a lateral mode selection element.

23. The assembly of claim 21, wherein the mode selection element is a longitudinal mode selection element.

24. The assembly of claim 21, wherein the mode selection element is a controllable phase shifting element.

25. The assembly of claim 1, wherein the first and second reflectors define a laser cavity, and at least one of the first and second reflectors is tunable.

26. The assembly of claim 25, wherein at least one of the first and second reflectors is a distributed Bragg reflector.

27. The assembly of claim 25, wherein both of the first and second reflectors are distributed Bragg reflectors.

28. The assembly of claim 25, wherein a wavelength of maximum reflectivity of the tunable laser resonator is tunable.

29. The assembly of claim 1, wherein the tunable laser resonator has a multi-active region gain medium.

30. The assembly of claim 1, wherein the wider wavelength range is greater than 15 nm.

31. The assembly of claim 4, wherein the optical waveguide is curved in a plane of the substrate to be non parallel to an optical axis of the tunable laser resonator.

32. The assembly of claim 5, wherein at least one of the optical waveguides is curved in a plane of the substrate to be non parallel to an optical axis of the tunable laser resonator.

33. The assembly of claim 20, wherein the areas of differing bandgap are formed by removeing offset quantum wells prior to regrowth.

34. The assembly of claim 20, wherein the areas of differing bandgap are formed by a butt-joint growth of the adjoining waveguides.

35. The assembly of claim 20, wherein the areas of differing bandgap are formed by selective area growth.

36. The assembly of claim 20, wherein the areas of differing bandgap are formed by quantum-well intermixing.

37. The assembly of claim 36, wherein the quantum-well intermixing is achieved by bombarding selected portions of the epitaxial structure with ions, and annealing the epitaxial structure to diffuse impurities and vacancies in a selected region of the epitaxial structure to determine the region's optical properties.

38. The assembly of claim 1, wherein the following optical assembly is separate from the substrate.

* * * * *

UNITED STATES PATENT AND TRADEMARK OFFICE
CERTIFICATE OF CORRECTION

PATENT NO.   : 6,628,690 B1                                        Page 1 of 1
DATED        : September 30, 2003
INVENTOR(S)  : Gregory Fish and Larry Coldren It is certified that error appears in the above-identified patent and that said Letters Patent is hereby corrected as shown below:

Drawings,
Sheet 1/6, should be

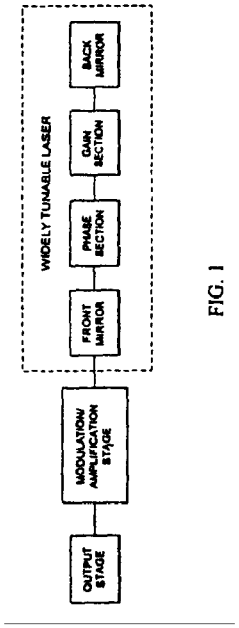

Signed and Sealed this

Sixteenth Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,628,690 B1
DATED : September 30, 2003
INVENTOR(S) : Gregory Fish et al.

It is certified that error appears in the above-identified patent and that said Letters Patent is hereby corrected as shown below:

Drawings,
Delete drawing sheet 6 and substitute therefore the drawing sheet, consisting of Fig. 6 as shown on the attached page.

Signed and Sealed this

Tenth Day of May, 2005

JON W. DUDAS
*Director of the United States Patent and Trademark Office*